United States Patent
Chao et al.

(10) Patent No.: US 6,287,924 B1
(45) Date of Patent: Sep. 11, 2001

(54) INTEGRATED CIRCUIT AND METHOD

(75) Inventors: Chih-Ping Chao, Plano; Ih-Chin Chen, Richardson; Rick L. Wise, Fairview; Katherine E. Violette; Sreenath Unnikrishnan, both of Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/407,213

(22) Filed: Sep. 28, 1999

Related U.S. Application Data

(60) Provisional application No. 60/101,236, filed on Sep. 21, 1998.

(51) Int. Cl.$^7$ .................................................. H01L 21/336
(52) U.S. Cl. ...................... 438/300; 438/303; 438/182; 438/197; 438/226
(58) Field of Search .................................. 438/300, 303, 438/182, 226, 269, 197

(56) References Cited

U.S. PATENT DOCUMENTS

| | | | | |
|---|---|---|---|---|
| 5,168,072 | * | 12/1992 | Moslehi | 437/41 |
| 5,314,832 | * | 5/1994 | Deleonibus | 437/27 |
| 5,352,631 | * | 10/1994 | Sitaram et al. | 437/200 |
| 5,358,879 | * | 10/1994 | Brady et al. | 437/44 |
| 5,496,750 | * | 3/1996 | Moslehi | 437/41 |
| 5,691,212 | * | 11/1997 | Tsai et al. | 437/24 |
| 5,710,450 | * | 1/1998 | Chau et al. | 257/344 |
| 5,824,586 | * | 10/1998 | Wollesen et al. | 438/300 |
| 5,869,359 | * | 2/1999 | Prabhakar | 438/149 |
| 5,920,783 | * | 7/1999 | Tseng et al. | 438/305 |
| 5,937,300 | * | 8/1999 | Sekine et al. | 438/300 |
| 5,953,605 | * | 9/1999 | Kodama | 438/231 |
| 5,994,191 | * | 11/1999 | Xiang et al. | 438/300 |
| 5,998,273 | * | 12/1999 | Ma et al. | 438/305 |
| 6,001,697 | * | 12/1999 | Chang et al. | 438/299 |

* cited by examiner

*Primary Examiner*—Eddie Lee
*Assistant Examiner*—N. Drew Richards
(74) *Attorney, Agent, or Firm*—Carlton H. Hoel; W. James Brady; Frederick J. Telecky, Jr.

(57) ABSTRACT

Sidewall spacers extending above a silicon gate with the distance between the spacers exceeding the length of the gate are used to confine selective silicon growth of the gate and subsequent self-aligned silicidation.

2 Claims, 2 Drawing Sheets

ND METHOD

INTEGRATED CIRCUIT AND METHOD

RELATED APPLICATIONS

This application claims priority to provisional application 60/101,236, filed Sep. 21, 1998.

BACKGROUND OF THE INVENTION

The invention relates to electronic semiconductor devices, and, more particularly, to transistor structures and fabrication methods for such structures.

The performance of high density integrated circuits depends upon transistor performance, but the scaling down of transistor dimensions makes it difficult to maintain low sheet resistance and low junction leakage for conventional titanium or cobalt self-aligned silicide processes. One of the major problems is that the sheet resistance of very narrow gates has a large range in resistance, which can have a significant impact on circuit performance. The large range in resistance is due to the difficulty in controlling the width of the narrow gates and controlling the self-aligned silicide on these narrow gates. A second problem is the gate silcide shorting to the source/drain silicide over the sidewall spacer as a result of incomplete removal of the metal on the sidewall spacer. An additional problem is that adjacent transistor gates can become shorted because the gate electrode silicide overgrowth may bridge to the next transistor gate. Another major problem is that the source/drain silicidation process can short through the shallow source/drain junctions of very short channel transistors.

Nakahara et al, "Ultra-shallow in-situ-doped raised source/drain structure for sub-tenth micron CMOS", 1996 Symp VLSI Tech Dig 174–175 improves transistor performance by use of a raised source/drain structure.

SUMMARY OF THE INVENTION

The present invention provides a transistor structure with a raised source/drain combined with a T-shaped gate for a self-aligned silicidation.

This has the advantages of low values of gate resistance with very small resistance variations and very low incidence of gate-to-source/drain shorting as well as gate-to-adjacent-gate shorting.

BRIEF DESCRIPTION OF THE DRAWINGS

The drawings are heuristic for clarity.

DESCRIPTION OF THE PREFERRED EMBODIMENTS

Overview

The preferred embodiments combine raised source/drain with T-shaped gates to provide robust self-aligned silicidation for a transistor.

First Preferred Embodiment

Figure 1:
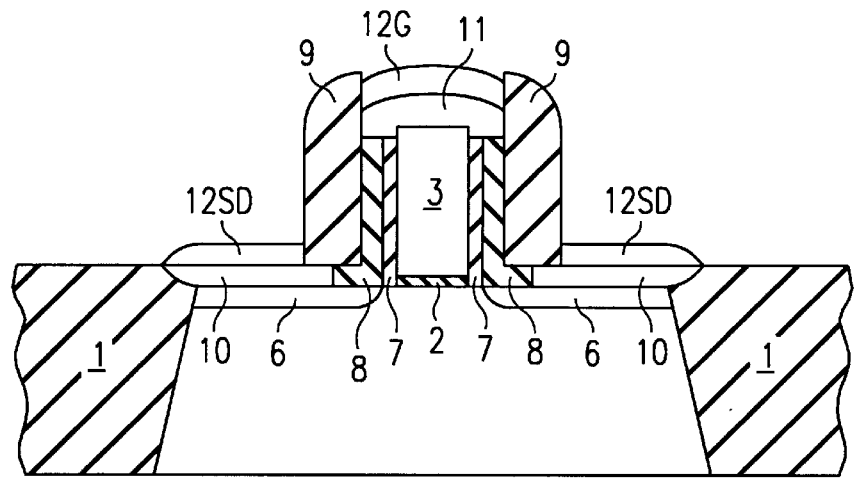
FIG. 1 is a cross sectional elevation views of a preferred embodiment integrated circuit transistor.

FIG. 1 illustrates in cross sectional elevation view first preferred embodiment transistor 100. Transistor 100 has laterally-confined selective silicon 11 formed on top of polysilicon gate 3 and a laterally confined self-aligned suicide film 12G formed on silicon 11. Self-aligned silicided source/drain 12SD is also formed on the raised source/drain selective silicon 10 grown on the source/drain diffusions 6.

The multilayer sidewall structure on the polysilicon gate 3 consists of spacer 7 which is a thermal oxide grown on the polysilicon gate 3 together with an optional deposited oxide or silicon nitride film, spacer 8 which is a deposited oxide spacer, and silicon nitride spacer 9. The gate dielectric 2 (made of oxide or nitride or nitrided oxide or other dielectric) and field oxide 1 are on a single crystal silicon or SOI substrate.

Typical dimensions would include: polysilicon 3 width (which is the gate length and the distance left-to-right in FIG. 1) of 100–130 nm; polysilicon 3 height of 90–220 nm; gate dielectric 2 thickness of 2 to 10 nm; sidewall oxide 7 thickness of 6–20 nm; sidewall oxide 8 of thickness of 10–20 nm; sidewall nitride 9 thickness of 20–120 nm; selective epitaxial silicon 10 (and 11) thickness of 30–70 nm; and silicide 12G–12DS thickness of 30–70 nm. The top (silicon 11 and silicide 12G) of the gate extends 15–40 nm beyond polysilicon 3. on each side, so the top increases the gate width (and thereby reduces the gate resistance) by roughly 25–80%. And the confinement of the gate top by sidewall nitride 9 prevents the shorting from gate to source/drain.

Fabrication Method Preferred Embodiment

FIGS. 2–5 illustrate the steps of a preferred embodiment fabrication method for integrated circuits (e.g., CMOS or BiCMOS) as follows.

Figure 2:
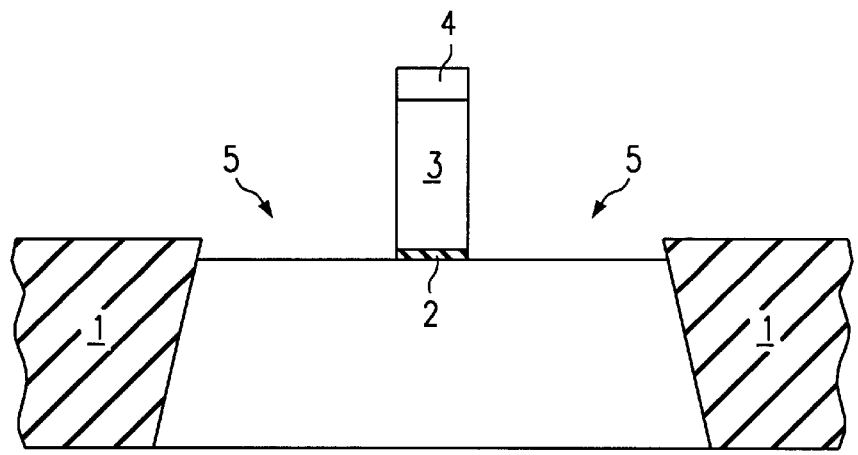
FIGS. 2–5 illustrate in cross sectional elevation views steps of a preferred embodiment fabrication method.
Figure 3:
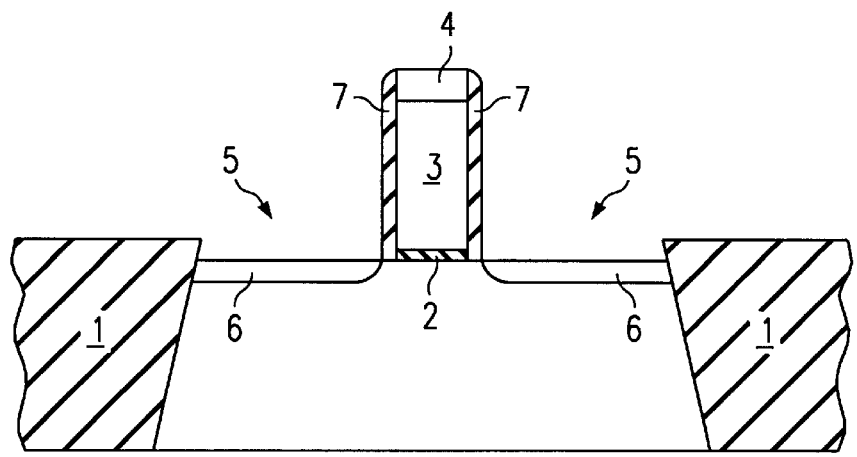

(1) Start with a silicon wafer (or silicon on insulator wafer) with shallow trench isolation and twin wells for CMOS devices (optionally, plus memory cell array wells and bipolar device buried layers). Perform threshold adjustment implants (which may differ for cell transistors and various peripheral transistors), and form gate dielectric 2 by thermal oxidation. Deposit polysilicon gate material (thickness 200 nm) and dope the polysilicon either n-type or p-type (depending upon transistor type) by implantation of phosphorus or boron; alternatively, the polysilicon can be doped as part of a source/drain implant in a subsequent step. Deposit a 30–150 nm thick cap silicon dioxide (or PSG) layer, then photolithographically pattern the layers to form oxide-topped gates plus gate level interconnects. The gate material could also provide a polysilicon emitter for bipolar devices which would also require a prior base implant. See FIG. 2 which shows a silicon substrate with shallow trench isolation oxide 1 plus gate oxide 2, gate polysilicon 3, cap oxide 4, and source/drain regions 5. FIG. 2 is a cross section along the gate length (which may be 130 nm), and gates typically have widths much greater than their lengths. The etching to form the gate oxide/gate polysilicon stack may be RIE with a CHF3+CF4 plasma for the oxide and Cl2+HBr for the polysilicon.

(2) Grow sidewall oxide 7 by thermal oxidation of polysilicon 3 to a thickness of 6–20 nm; this also grows 3–10 nm of oxide on the exposed source/drain regions 5 of the silicon substrate. Perform lightly doped drain implants 6 through the oxide on the source/drain regions 5; see FIG. 3. An optional medium doped drain implant could be performed after an optional deposition of 10–40 nm thick conformal oxide or nitride followed by an anisotropic etchback to form sidewall spacers on the thermal oxide spacers. The optional sidewall spacer can be added to just some of the NMOS devices or just some of the PMOS devices or to all transistors of either or both types. Cap oxide (PSG) 4 is thick enough to avoid being totally removed during the anisotropic etchback to form the optional spacers. The optional sidewall spacers are shown as part of sidewall spacer 7 in the Figures.

Figure 4:
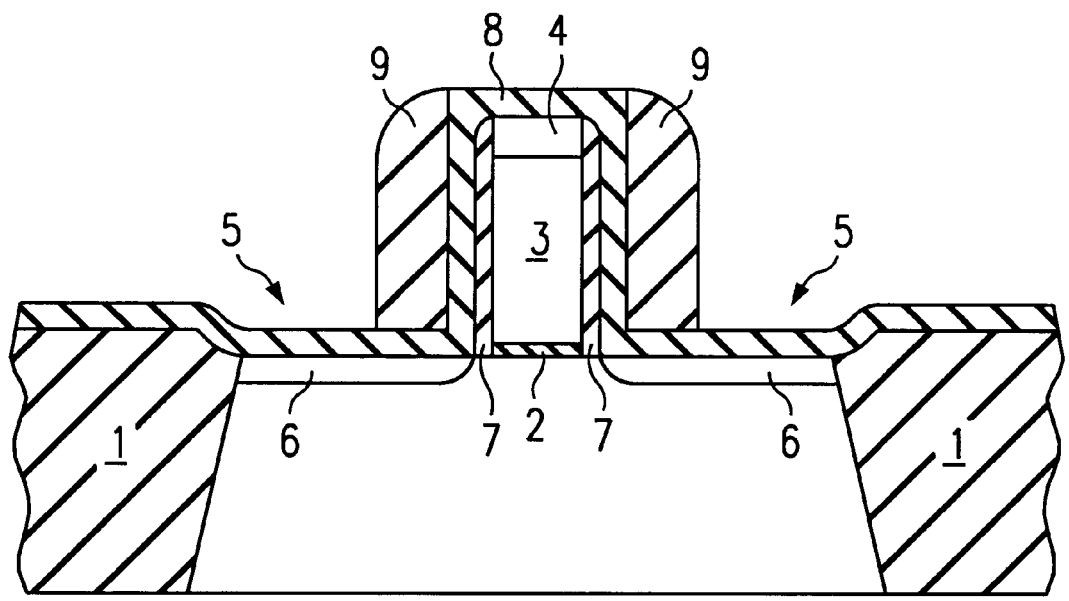

(3) Deposit 10–60 nm thick conformal oxide layer 8 by decomposition of TEOS and then deposit 20–120 nm thick conformal nitride layer 9 by reaction of dichlorosilane plus ammonia. Etchback with an anisotropic RIE etch which etches nitride 9 selectively (i.e., 3 to 1) with respect to oxide 8 to form sidewall nitride spacers 9. The etch clears nitride from the horizontal surfaces but retains much of underlying oxide 8. The etch could use a mixture of SF6, Cl2, CHF3. FIG. 4 shows thermal sidewall oxide plus optional medium doped drain sidewall spacer as a single sidewall spacer 7.

Figure 5:
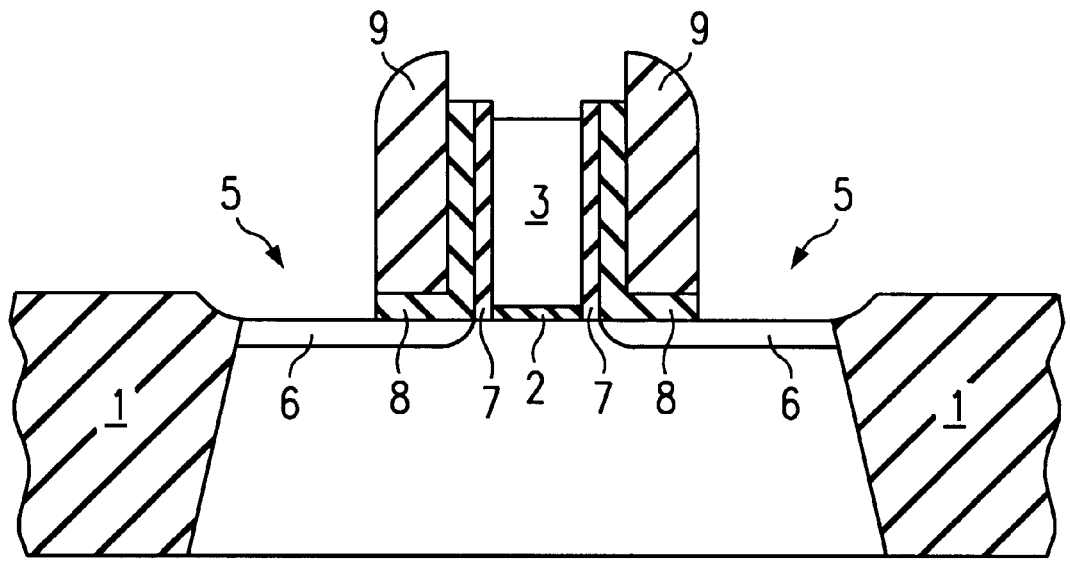

(4) Anisotropically etch the exposed (horizontal) portions of oxide layer 8 with RIE using, for example, CHF3+CF4. Then strip remaining cap oxide (PSG) 4 with HF (wet or vapor); see FIG. 5 showing the multilayer sidewall spacer structure of thermal oxide plus medium doped drain spacer 7, TEOS spacer 8, and nitride spacer 9. Note that nitride spacer 9 extends higher than polysilicon 3 and spacers 7–8 due to being deposited over oxide (PSG) 4 which was later removed.

(5) Selectively grow epitaxial silicon on source/drain regions 5 and the top of gate polysilicon 3 as follows. Prebake the wafer at 900 C. under an H2 ambient in a high intensity lamp-heated room temperature chemical vapor deposition system; the prebake cleans native oxide from the silicon surfaces. Next, flow a mixture of dichlorosilane, HCl, and H2 at 850 C. over the wafer; this selectively grows epitaxial silicon with a uniformity of 5%. Time the silicon growth to form 30–70 nm thick silicon 10 on source/drain regions 5; this also grows about 27–90 nm of silicon 11 on top of polysilicon 3. Note that nitride spacers 9 extend about 100 nm above the top of gate polysilicon 3 due to the thickness of original cap oxide 4; thus nitride spacers 9 confine silicon 11.

(6) Implant silicon 10 with arsenic and boron to form NMOS and PMOS, respectively, raised source/drains; this also dopes silicon 11.

(7) Blanket deposit (e.g., sputter) titanium or cobalt and react the metal with the underlying exposed silicon 10–11 to form self-aligned silicide; and strip the unreacted metal (or TiN in the case of titanium reacted in a nitrogen atmosphere). Note that sidewall nitride 9 laterally confines the silicide. This completes the transistor of FIG. 1.

(8) Complete an integrated circuit by further processing steps such as the following. Cover the gate level structure with a planarized dielectric layer (e.g., BPSG or oxide and planarize by CMP). For an embedded memory cell array using one-transistor one-capacitor memory cells, the bitlines and cell capacitors may be formed next. Photolithographically define and etch holes (contacts, vias) in planarized dielectric down to selected source/drains and locations on gate level interconnects. Blanket deposit (including filling vias) first level metal (e.g., tungsten or TiN clad aluminum or TaN clad copper). Photolithographically define and etch the first level metal to form first level interconnects. Repeat the dielectric deposition, via etch, metal deposition and patterning to form further metal interconnect levels. Top level metal may include bond pads and fuses, and a passivation overcoat (e.g., nitride) has openings to bond pads for probe testing. Functional circuits then are mounted, bond wired, and packaged.

Similarly, damascene metal interconnect levels could be used to complete the integrated circuit.

Modifications

The preferred embodiments can be modified in various ways while retaining the features of selective epitaxial silicon for raised source/drains plus lateral expansion of the polysilicon gate with sidewall spacer confinement, both for silicon growth and subsequent silicidation. For example, the materials may be varied, such as an initial nitride cap on the polysilicon, the nitride can be removed with hot phosphoric acid analogous to the preferred embodiment oxide cap being removed with HF. A nitride cap goes with a nitride inner sidewall spacer and an oxide outer spacer, the oxide outer spacer then confines the selective epitaxial silicon growth. Also, the lateral extent of the silicon grown on the gate can be increased (by increasing sidewall spacer dimensions) so the top of the gate is 2 or more times the length of the bottom of the gate.

What is claimed is:

1. A method of transistor fabrication, comprising the steps of:

(a) forming sidewall spacers on a silicon gate over a silicon substrate, the spacers extending above the top of the silicon gate and with a distance between the spacers greater than the distance across the top of said silicon gate; and (b) selectively growing silicon on said substrate to form raised source/drain regions and to extend said silicon gate both upward and laterally between said sidewall spacers.

2. The method of claim 1, further comprising the step of:

(a) siliciding said raised source/drain regions and said extended silicon gate, the resulting silicided gate between said sidewall spacers.

* * * * *